(12) United States Patent
Ott

(10) Patent No.: US 6,294,935 B1
(45) Date of Patent: Sep. 25, 2001

(54) BUILT-IN-SELF-TEST CIRCUITRY FOR TESTING A PHASE LOCKED LOOP CIRCUIT

(75) Inventor: Russell George Ott, East Brunswick, NJ (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/690,267

(22) Filed: Oct. 17, 2000

(51) Int. Cl.[7] .................................................. H03L 7/06
(52) U.S. Cl. .............................................. 327/150; 331/17
(58) Field of Search ..................................... 327/147, 150, 327/152, 156, 160, 161; 331/17, 25, DIG. 2; 324/622, 76.77, 85

(56) References Cited

U.S. PATENT DOCUMENTS

| | | | |
|---|---|---|---|
| 5,381,085 | * | 1/1995 | Fischer .................................. 327/159 |
| 5,729,151 | * | 3/1998 | Zoerner et al. ....................... 324/763 |
| 6,005,904 | * | 12/1999 | Knapp et al. .................... 331/DIG. 2 |
| 6,121,816 | * | 9/2000 | Tonks et al. .......................... 327/150 |
| 6,201,448 | * | 3/2001 | Tam et al. ............................. 327/158 |

OTHER PUBLICATIONS

Edward J. McCluskey, Built–In Self–Test Techniques, *IEEE Design & Test*, vol. 2, No. 2, Apr. 1985, pp. 21–28.
Edward J. McCluskey, Built–In Self–Test Structures, *IEEE Design & Test*, vol. 2, No. 2, Apr. 1985, pp. 29–36.
"0.20–Micron VSC10PL01 Clock Distribution PLL", Available from Philips Electronics North America Corporation, 1251 Avenue of the Americas, New York, New York 10020.

* cited by examiner

*Primary Examiner*—Kenneth B. Wells
*Assistant Examiner*—Linh M. Nguyen
(74) *Attorney, Agent, or Firm*—Douglas L. Weller

(57) ABSTRACT

A built-in-self-test circuit aids in testing a phase locked loop circuit. The phased locked loop has a plurality of frequency multipliers. The built-in-self-test circuit includes a frequency divider and a multiplexer. The frequency divider has a plurality of divide-by-counters. For each frequency multiplier within the plurality of frequency multipliers there is a corresponding divide-by-counter. A ratio of a multiplier for each frequency multiplier to a divider of its corresponding divide-by-counter is a constant for all frequency multipliers and corresponding divide-by-counters. When a frequency multiplier within the plurality of frequency multipliers is selected, the multiplexer selects its corresponding divide-by-counter to produce a test output clock.

15 Claims, 3 Drawing Sheets

BUILT-IN-SELF-TEST CIRCUITRY FOR TESTING A PHASE LOCKED LOOP CIRCUIT

BACKGROUND

The present invention concerns circuit testing. More particularly, the present invention relates to built-in-self-test (BIST) circuitry for testing a phase locked loop (PLL) circuit.

Once manufactured, it is necessary to test very large scale integrated (VLSI) circuits to detect processing faults which could impair or inhibit correct operation of the circuit. Typically, this has been done by the external application of various test stimuli to inputs of the circuit and checking the actual response with an expected response.

As the complexity of some circuits increase, it is increasingly difficult to thoroughly test such circuits using just the external application of test stimuli. To facilitate testing of these more complex circuits, built-in self-test (BIST) circuitry is often included within the manufactured circuit to serve as an aid in the testing process. See for example, Edward J. McCluskey, Built-In-Self-Test Techniques, *IEEE Design & Test*, Volume 2, Number 2, April 1985, pages 21–28. See also, Edward J. McCluskey, Built-In Self-Test Structures, *IEEE Design & Test*, Volume 2, Number 2, April 1985, pages 29–36.

SUMMARY OF THE INVENTION

In accordance with the preferred embodiment of the present invention, a built-in-self-test circuit aids in testing a phase locked loop circuit. The phased locked loop has a plurality of frequency multipliers. The built-in-self-test circuit includes a frequency divider and a multiplexer. The frequency divider has a plurality of divide-by-counters. For each frequency multiplier within the plurality of frequency multipliers there is a corresponding divide-by-counter. A ratio of a multiplier for each frequency multiplier to a divider of its corresponding divide-by-counter is a constant for all frequency multipliers and corresponding divide-by-counters. When a frequency multiplier within the plurality of frequency multipliers is selected, the multiplexer selects its corresponding divide-by-counter to produce a test output clock.

In a specific preferred embodiment, the constant is ½. In this embodiment the plurality of frequency multipliers includes a six times frequency multiplier, a five times frequency multiplier, a four times frequency multiplier, a three times frequency multiplier and a two times frequency multiplier. The plurality of divide-by-counters includes a divide by twelve counter, a divide by ten counter, a divide by eight counter, a divide by six counter and a divide by four counter. Multiplier select lines are used by the PLL to select a frequency multiplier and by the multiplexer for selecting its corresponding divide-by-counter.

The present invention provides for efficient and accurate testing of a phased locked loop regardless of frequency multiplication performed by the phased locked loop.

DESCRIPTION OF THE PREFERRED EMBODIMENT

Figure 1:
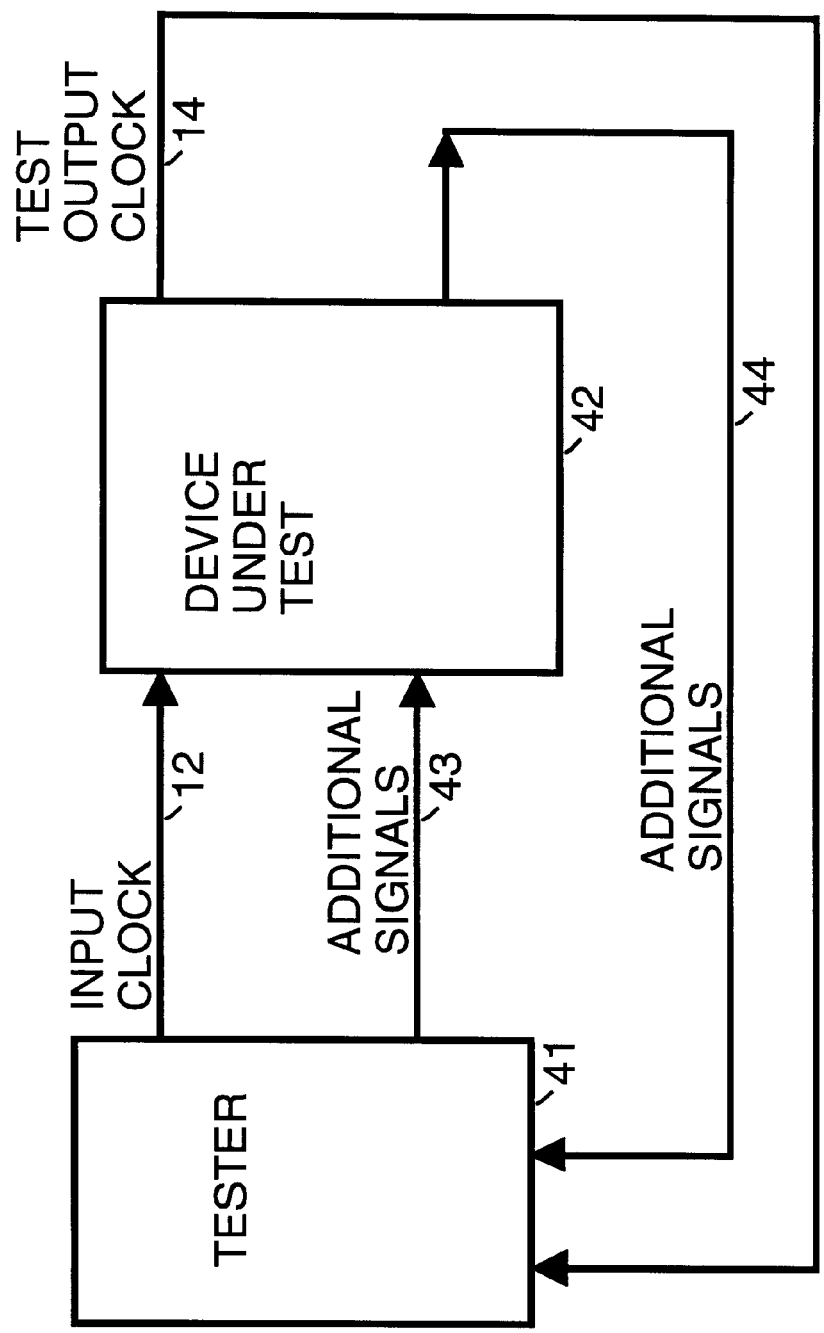
FIG. 1 is a block diagram that shows a tester testing a device.

FIG. 1 is a block diagram showing a tester 41 connected to a device-under-test 42. Tester 41 supplies an input clock 12 to device-under-test 42, along with additional signals 43. Device-under-test 42 generates a test output clock 14 along with additional signals 44. For example tester 41 is a digital tester.

Figure 2:
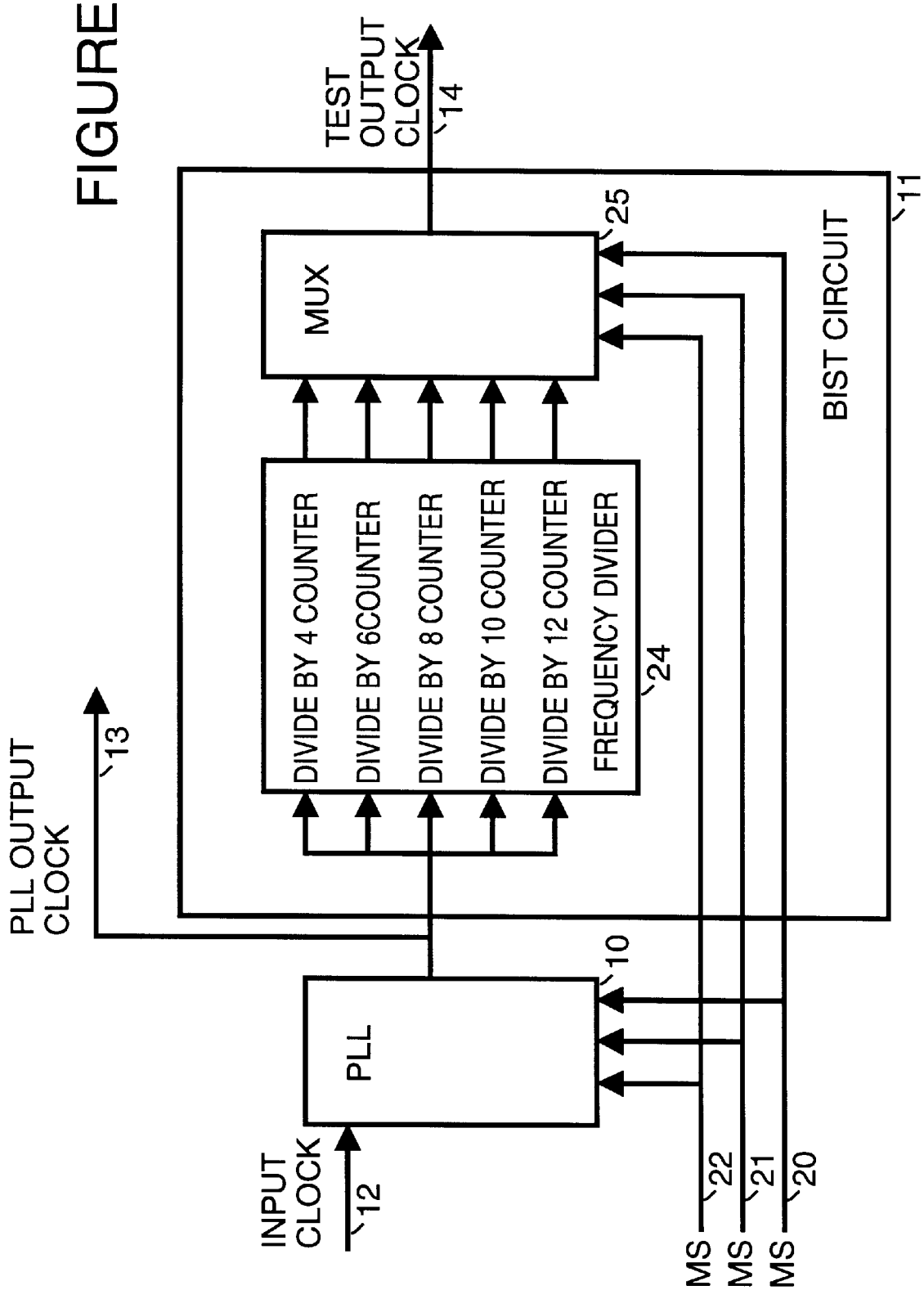
FIG. 2 shows a built-in-self-test (BIST) circuit that aids in testing a phase locked loop (PLL) in accordance with an alternative preferred embodiment of the present invention.
Figure 3:
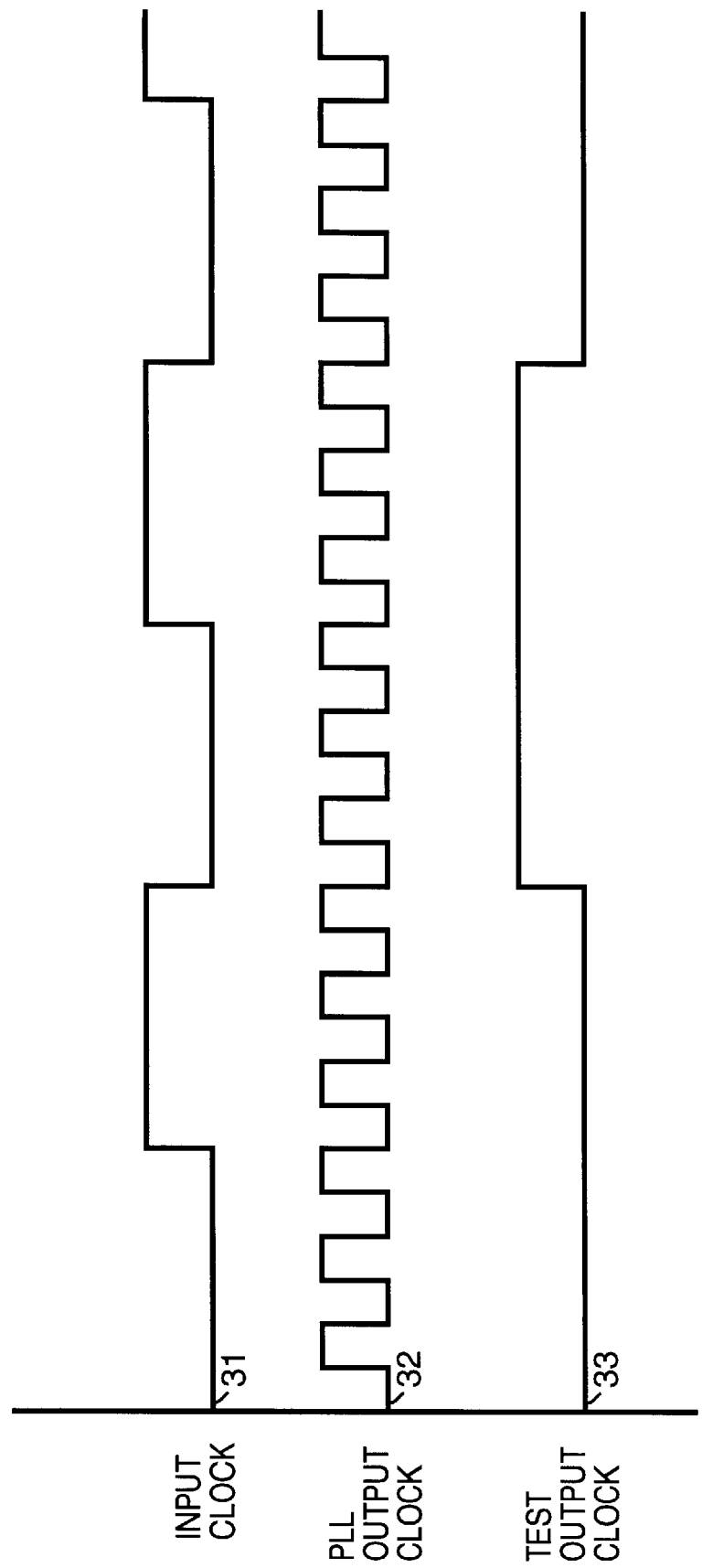
FIG. 3 is a timing diagram for the circuitry shown in FIG. 2 in accordance with an alternative preferred embodiment of the present invention.

FIG. 2 shows a simplified block diagram of device-under-test 42. Device-under-test 14 includes a phased lock loop (PLL) 10 and a built-in-self-test (BIST) circuit as well as additional circuitry.

Digital testers generally test output waveforms only once per tester cycle. However, a PLL can multiply a tester generated input clock so that the output clock from the PLL switches many times in one tester cycle. Thus a PLL output clock 13 can have a frequency many times higher than input clock 12.

BIST circuit 11 allows tester 41 (shown in FIG. 1) to determine if the output clock 13 of PLL 10 is correct. BIST circuit 11 divides the frequency of output clock 13 to produce a signal with a frequency of one-half the frequency of input clock 12 (which serves as input to PLL 10), as shown in FIG. 2.

PLL 10, for example, includes a number of different frequency multipliers. For example, PLL 10 includes a six-times frequency multiplier that multiplies the frequency of input clock 12 six times to produce output clock 13. PLL 10 includes a five-times frequency multiplier that multiplies the frequency of input clock 12 five times to produce output clock 13. PLL 10 includes a four-times frequency multiplier that multiplies the frequency of input clock 12 four times to produce output clock 13. PLL 10 includes a three-times frequency multiplier that multiplies the frequency of input clock 12 three times to produce output clock 13. PLL 10 includes a two-times frequency multiplier that multiplies the frequency of input clock 12 two times to produce output clock 13.

BIST circuit 11 allows tester 41 to test PLL 10 within device-under-test 42 independent of tester cycle time and the PLL frequency multiplier. Frequency divider 24 includes a divide by four counter, a divide by six counter, a divide by eight counter, a divide by ten counter and a divide by twelve counter. A multiplexer (MUX) 25 selects an output from frequency divider 24 so that test output clock 14 is always one-half the frequency of input clock 12. Multiplier select (MS) bits on MS lines 20, 21 and 22 are used to select the frequency multiplier within PLL 10 as well as control MUX 25 within BIST circuit 11.

Table 1 below shows for each combination of MS bits (i.e. the values on MS line 22, MS line 21 and MS line 20) which frequency multiplier within PLL 10 is selected and which divide-by counter within frequency divider 24 is selected by multiplexer 25 to produce test output clock 14.

TABLE 1

| MS bits | | | PLL output | Counter | Output Test |
|---|---|---|---|---|---|
| 22 | 21 | 20 | clock freq. | selected | Clock freq. |
| 1 | 1 | 1 | N/A | N/A | N/A |
| 1 | 1 | 0 | N/A | N/A | N/A |
| 1 | 0 | 1 | 6 × freq. | Divide by 12 | ½ freq. |
| 1 | 0 | 0 | 5 × freq. | Divide by 10 | ½ freq. |
| 0 | 1 | 1 | 4 × freq. | Divide by 8 | ½ freq. |

TABLE 1-continued

| MS bits | | | PLL output clock freq. | Counter selected | Output Test Clock freq. |
|---|---|---|---|---|---|
| 22 | 21 | 20 | | | |
| 0 | 1 | 0 | 3 × freq. | Divide by 6 | ½ freq. |
| 0 | 0 | 1 | 2 × freq. | Divide by 4 | ½ freq. |
| 0 | 0 | 0 | N/A | N/A | N/A |

As shown by Table 1 above, the frequency of the test clock output 14 is one-half the frequency (½ freq) of input clock 12. This is true for every value of the multiplier select (MS) bits for which PLL 10 performs a frequency multiplication.

Thus, when the MS bits are equal to 101 (MS 22 equals 1, MS 21 equals 0 and MS 20 equals 1), output clock 13 of PLL 10 is equal to six times the frequency (6×freq) of input clock 12, multiplexer 25 selects the divide by 12 counter within frequency dividers 24, and the frequency of the test clock output 14 is one-half the frequency (½ freq) of input clock 12. When the MS bits are equal to 100 (MS 22 equals 1, MS 21 equals 0 and MS 20 equals 0), output clock 13 of PLL 10 is equal to five times the frequency (5×freq) of input clock 12, multiplexer 25 selects the divide by 10 counter within frequency dividers 24, and the frequency of the test clock output 14 is one-half the frequency (½ freq) of input clock 12.

When the MS bits are equal to 011 (MS 22 equals 0, MS 21 equals 1 and MS 20 equals 1), output clock 13 of PLL 10 is equal to four times the frequency (4×freq) of input clock 12, multiplexer 25 selects the divide by 8 counter within frequency dividers 24 and the frequency of the test clock output 14 is one-half the frequency (½ freq) of input clock 12. When the MS bits are equal to 010 (MS 22 equals 0, MS 21 equals 1 and MS 20 equals 0), output clock 13 of PLL 10 is equal to three times the frequency (3×freq) of input clock 12, multiplexer 25 selects the divide by six counter within frequency dividers 24 and the frequency of the test clock output 14 is one-half the frequency (½ freq) of input clock 12. When the MS bits are equal to 001 (MS 22 equals 0, MS 21 equals 0 and MS 20 equals 1), output clock 13 of PLL 10 is equal to twice the frequency (2×freq) of input clock 12, multiplexer 25 selects the divide by 4 counter within frequency dividers 24 and the frequency of the test clock output 14 is one-half the frequency (½ freq) of input clock 12. The other values for the MS bits are unused in this embodiment.

When the frequency of the test clock output 14 is one-half the frequency (½ freq) of input clock 12 tester 41 can strobe test output clock 14 near the end of each tester cycle, just before the next high-to-low transition on the input clock 12. This strobe time will be the same for all values of the multiplier select inputs 20 through 22.

The number and values of frequency multipliers within PLL 10 is an example. As will be understood by persons of ordinary skill in the art, the present invention applies to testing of PLLs that vary widely in the number and values of frequency multipliers. For example, the VSC10PL01 Clock Distribution PLL has a programmable multiplier selected by 10 Multiplier select inputs to program the frequency multiplier from 1 to 1024. The present invention can be used to test any combination of frequency multiplication.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A built-in-self-test circuit for aid in testing a phase locked loop circuit having a plurality of frequency multipliers, the built-in-self-test circuit comprising:

a frequency divider having a plurality of divide-by-counters, wherein for each frequency multiplier within the plurality of frequency multipliers there is a corresponding divide-by-counter, a ratio of a multiplier for each frequency multiplier to a divider of its corresponding divide-by-counter is a constant for all frequency multipliers and corresponding divide-by-counters; and, a multiplexer for, when a frequency multiplier within the plurality of frequency multipliers is selected, selecting its corresponding divide-by-counter to produce a test output clock.

2. A built-in-self-test as in claim 1 wherein the constant is ½.

3. A built-in-self-test as in claim 1 wherein multiplier select lines are used by the PLL to select a frequency multiplier and by the multiplexer for selecting its corresponding divide-by-counter.

4. A built-in-self-test as in claim 1 wherein the plurality of frequency multipliers includes:

a six times frequency multiplier;

a five times frequency multiplier;

a four times frequency multiplier;

a three times frequency multiplier; and, a two times frequency multiplier.

5. A built-in-self-test as in claim 1 wherein the plurality of frequency multipliers includes:
   a six times frequency multiplier,
   a five times frequency multiplier,
   a four times frequency multiplier,
   a three times frequency multiplier, and
   a two times frequency multiplier; and, the plurality of divide-by-counters includes:
   a divide by twelve counter,
   a divide by ten counter,
   a divide by eight counter,
   a divide by six counter, and
   a divide by four counter.

6. A method for testing a phase locked loop circuit having a plurality of frequency multipliers, the method comprising the following steps:

(a) selecting a frequency multiplier within the plurality of frequency multipliers; and, (b) selecting a divide-by-counter corresponding to the frequency multiplier selected in step (a), the frequency divider being one of a plurality of divide-by-counters within a frequency divider, wherein for each frequency multiplier within the plurality of frequency multipliers there is a corresponding divide-by-counter, a ratio of a multiplier for each frequency multiplier to a divider of its corresponding divide-by-counter is a constant for all frequency multipliers and corresponding divide-by-counters, the divide-by-counter receiving an output clock from the phased locked loop and producing an test output clock.

7. A method as in claim 6 wherein in step (b) the constant is ½.

8. A method as in claim 6 wherein selection in step (a) and step (b) is controlled using multiplier select lines.

9. A method as in claim 6 wherein the plurality of frequency multipliers includes:
- a six times frequency multiplier;
- a five times frequency multiplier;
- a four times frequency multiplier;
- a three times frequency multiplier; and,
- a two times frequency multiplier.

10. A method as in claim 6 wherein
the plurality of frequency multipliers includes:
- a six times frequency multiplier,
- a five times frequency multiplier,
- a four times frequency multiplier,
- a three times frequency multiplier, and
- a two times frequency multiplier; and, in step (b) the plurality of divide-by-counters includes:
- a divide by twelve counter,
- a divide by ten counter,
- a divide by eight counter,
- a divide by six counter, and
- a divide by four counter.

11. A circuit comprising:
a phase locked loop circuit having a plurality of frequency multipliers, the phased locked loop having an input clock and an output clock;
a built-in-self-test circuit including:
 a frequency divider for receiving and dividing the output clock, the frequency divider having a plurality of divide-by-counters, wherein for each frequency multiplier within the plurality of frequency multipliers there is a corresponding divide-by-counter, a ratio of a multiplier for each frequency multiplier to a divider of its corresponding divide-by-counter is a constant for all frequency multipliers and corresponding divide-by-counters;
 a multiplexer for, when a frequency multiplier within the plurality of frequency multipliers is selected, selecting its corresponding divide-by-counter to produce a test output clock.

12. A circuit as in claim 11 wherein the constant is ½.

13. A circuit as in claim 11 wherein multiplier select lines are used by the PLL to select a frequency multiplier and by the multiplexer for selecting its corresponding divide-by-counter.

14. A circuit as in claim 11 wherein the plurality of frequency multipliers includes:
- a six times frequency multiplier;
- a five times frequency multiplier;
- a four times frequency multiplier;
- a three times frequency multiplier; and,
- a two times frequency multiplier.

15. A circuit as in claim 11 wherein
the plurality of frequency multipliers includes:
- a six times frequency multiplier,
- a five times frequency multiplier,
- a four times frequency multiplier,
- a three times frequency multiplier, and
- a two times frequency multiplier; and, the plurality of divide-by-counters includes:
- a divide by twelve counter,
- a divide by ten counter,
- a divide by eight counter,
- a divide by six counter, and
- a divide by four counter.

* * * * *